(12) United States Patent
Yoshida et al.

(10) Patent No.: US 6,211,602 B1
(45) Date of Patent: Apr. 3, 2001

(54) ACTUATOR USING ELECTROMECHANICAL TRANSDUCER CAPABLE OF BEING USED IN HIGH TEMPERATURE AND HIGH HUMIDITY ENVIRONMENT AND APPARATUS HAVING THE SAME

(75) Inventors: Ryuichi Yoshida, Sakai; Yasuhiro Okamoto, Tondabayashi; Yoshitaka Sugimoto, Izumi, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/103,309

(22) Filed: Jun. 23, 1998

(30) Foreign Application Priority Data

Jun. 24, 1997 (JP) .................................................. 9-181879

(51) Int. Cl.⁷ ...................................................... H02N 2/00
(52) U.S. Cl. ...................... 310/323.01; 323/328; 323/340
(58) Field of Search .............................. 310/328, 323.01, 310/323.17, 340, 346

(56) References Cited

U.S. PATENT DOCUMENTS

| | | | |
|---|---|---|---|
| 4,051,396 | * | 9/1977 | Berlincourt ........................... 310/340 |
| 4,662,212 | * | 5/1987 | Noguchi et al. .......................... 73/24 |
| 5,253,010 | | 10/1993 | Oku et al. .............................. 354/485 |
| 5,331,241 | * | 7/1994 | Itoh ...................................... 310/328 |
| 5,589,723 | | 12/1996 | Yoshida et al. ....................... 310/328 |
| 5,747,672 | * | 5/1998 | Parent et al. ......................... 73/61.79 |
| 5,786,654 | * | 7/1998 | Yoshida et al. ....................... 310/328 |
| 5,920,145 | * | 7/1999 | Wu et al. .............................. 310/328 |

* cited by examiner

Primary Examiner—Thomas M. Dougherty
(74) Attorney, Agent, or Firm—Sidley & Austin

(57) ABSTRACT

An actuator using an electromechanical transducer capable of maintaining stable driving function even under a severe environment of high temperature and/or high humidity, or the like, and an apparatus mounted with the actuator. The actuator are disclosed is constituted to move a slider block frictionally coupled to a drive shaft in a predetermined direction by reciprocating oscillation having different speeds of the drive shaft driven by elongation and contraction displacements of a piezoelectric element and the piezoelectric element, a portion where the piezoelectric element is coupled to the drive shaft and a portion where the piezoelectric element is coupled to a frame is sealed by silicone resin, fluorinated resin or the like to thereby protect them from the high temperature and/or high humidity environment.

19 Claims, 8 Drawing Sheets

Fig. 5(a)
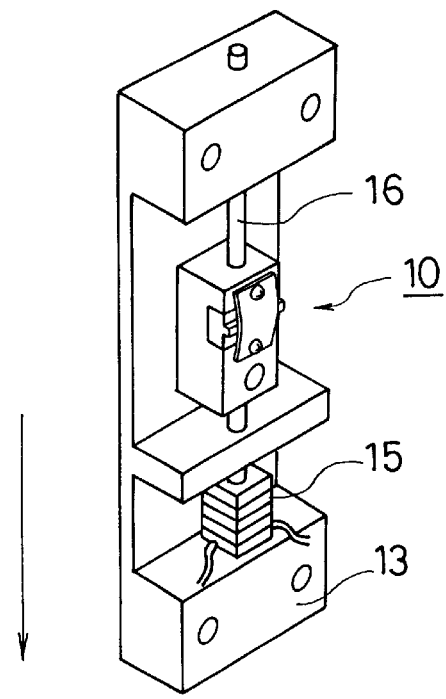
Fig. 5(c)
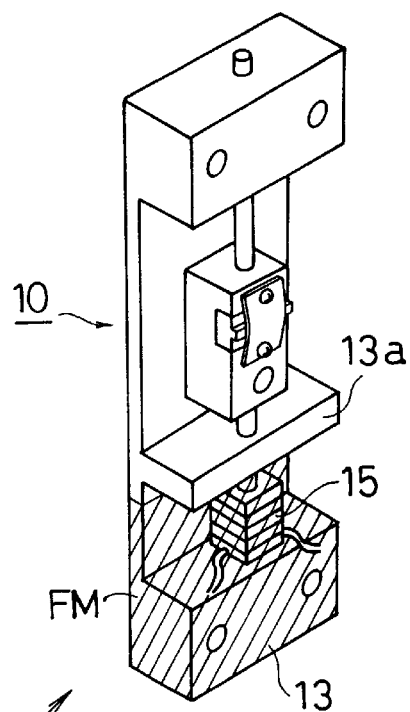
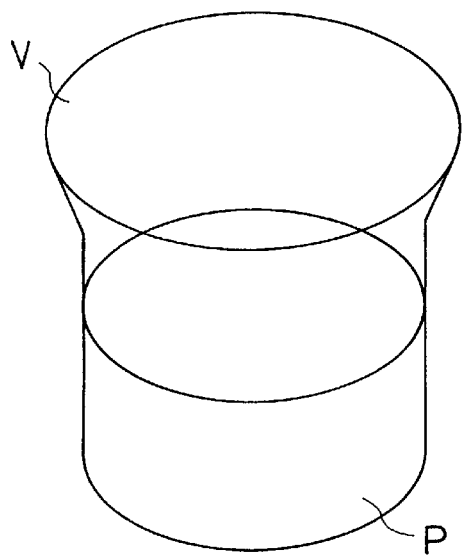
Fig. 5(b)
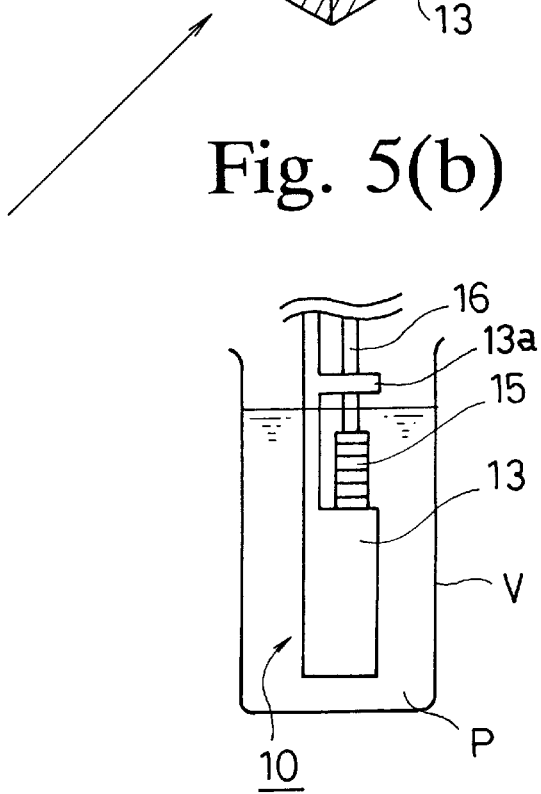

ACTUATOR USING ELECTROMECHANICAL TRANSDUCER CAPABLE OF BEING USED IN HIGH TEMPERATURE AND HIGH HUMIDITY ENVIRONMENT AND APPARATUS HAVING THE SAME

BACKGROUND OF THE INVENTION

1. Field of the Invention

The present invention relates to an actuator using an electromechanical transducer, for example, to an actuator using an electromechanical transducer which is suitable for driving general precision mechanical devices such as driving units of an X—Y axes movable stage, a photographing lens of a camera, a projecting lens of an overhead projector, a lens of a binocular and so on and which can maintain stable driving function even in a severe environment of high temperature, high humidity or the like.

Further, the present invention relates to an apparatus mounted with such an actuator for stably operating even in a severe environment of high temperature, high humidity or the like.

2. Prior Art

In driving an X—Y axes movable stage, a photographing lens of a camera or the like, a drive device using an electric motor has conventionally been used. The device is large-sized and drawbacks of generation of a magnetic field or generation of noise or the like have been pointed out. Hence, the applicant has proposed as means for resolving such various problems an actuator using an electromechanical transducer, that is, an actuator in which a moving member is frictionally coupled to a driving member that is fixedly coupled to an electromechanical transducer and displacements in elongation and contraction directions having different speeds are generated by applying drive pulses in a sawtooth waveform to the electromechanical transducer by which the moving member frictionally coupled to the driving member is moved in a predetermined direction.

According to the above-described conventional actuator, the piezoelectric element, a portion for fixedly adhering the piezoelectric element and a support block, and a portion for fixedly adhering the piezoelectric element and a drive shaft are integrated into an apparatus where it is used without conducting any special treatment therefor. However, when the apparatus to which the actuator of this kind is applied is used in an environment of high temperature or high humidity, there is a possibility which may cause inconvenience where electrodes of the piezoelectric element are shortcircuitted, the portion for fixedly adhering the piezoelectric element and the support block or the portion for fixedly adhering the piezoelectric element and the drive shaft are peeled off, the function is deteriorated, the apparatus cannot be driven or the like. Further, when the apparatus to which the actuator of this kind is applied is left in an environment of high temperature or high humidity, there is a possibility which may cause inconvenience where similarly, the fixedly adhered portion is peeled off, the function is deteriorated, the apparatus cannot be driven or the like.

SUMMARY OF THE INVENTION

It is a principal object of the present invention to provide an actuator using an electromechanical transducer capable of stably maintaining driving function even under a severe environment of high temperature, high humidity or the like.

It is another object of the present invention to provide an actuator using an electromechanical transducer which is constituted to prevent from suffering an influence of an environment of high temperature and high humidity by sealing the electromechanical transducer and a portion for bonding the electromechanical transducer and a driving member.

It is another object of the present invention to provide various apparatuses having as a drive source an actuator using an electromechanical transducer which does not suffer the influence of environment of high temperature and high humidity described above.

Still other object of the present invention will become apparent from a detailed explanation of the present invention in reference to the drawings.

BRIEF DESCRIPTION OF THE DRAWINGS

FIGS. 5(a), 5(b) and 5(c) are views for explaining steps of a sealing treatment of the actuator;

DETAILED DESCRIPTION OF THE PREFERRED EMBODIMENTS

Figure 1:
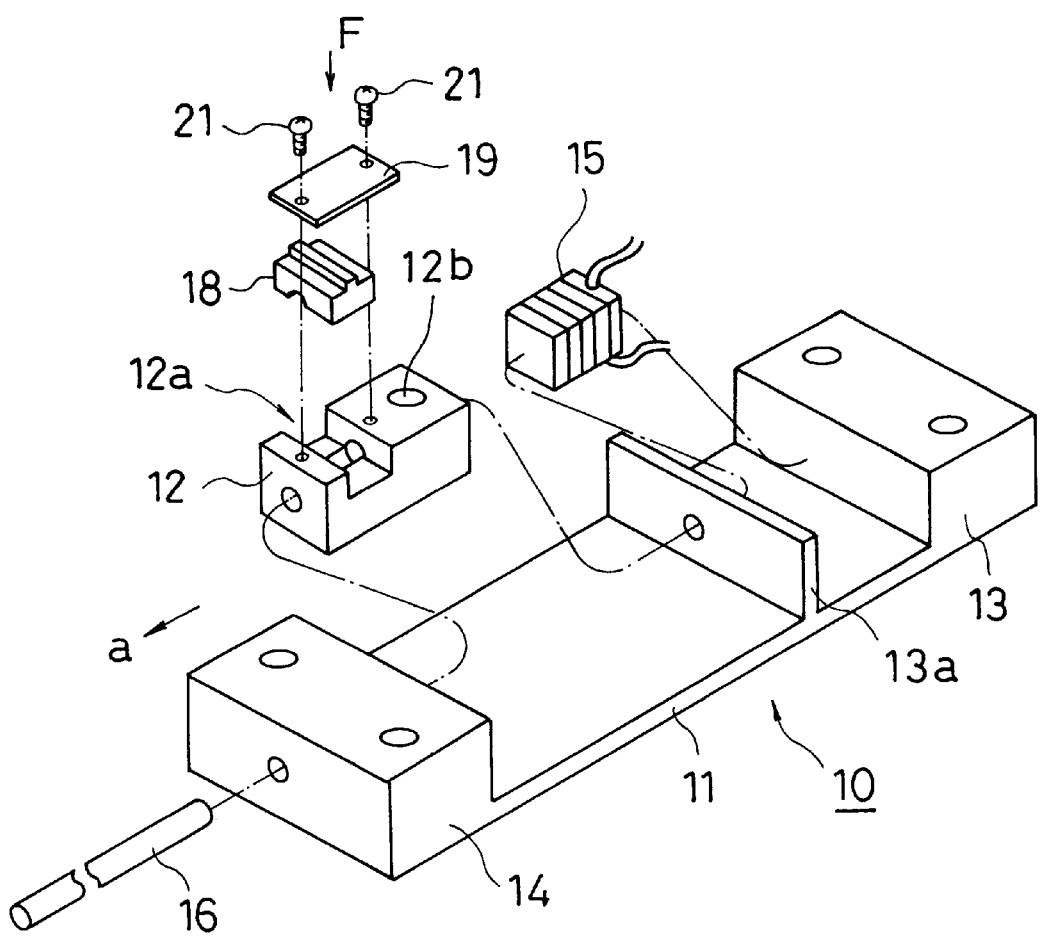
FIG. 1 is a perspective view of an actuator according to a first embodiment of the present invention which is disassembled into constituent members.
Figure 2:
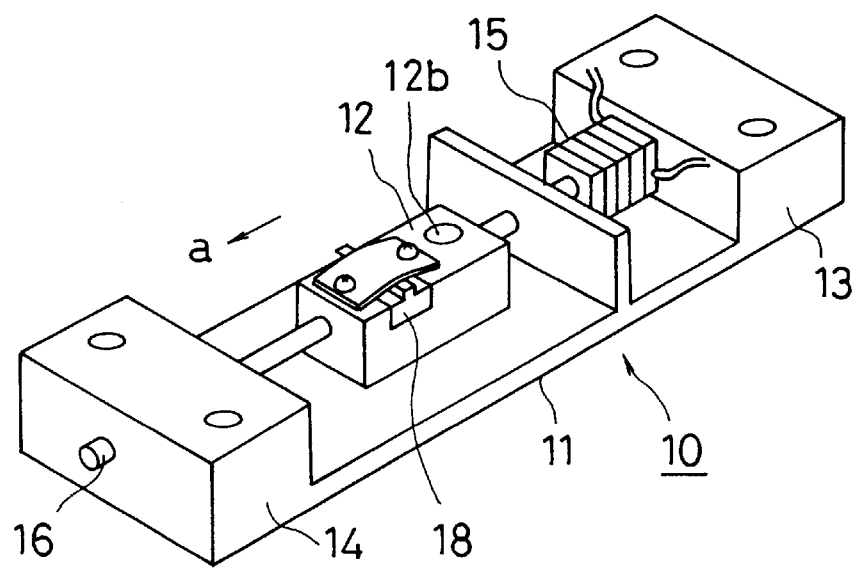
FIG. 2 is a perspective view showing a state of assembling the actuator shown by FIG. 1.
Figure 3:
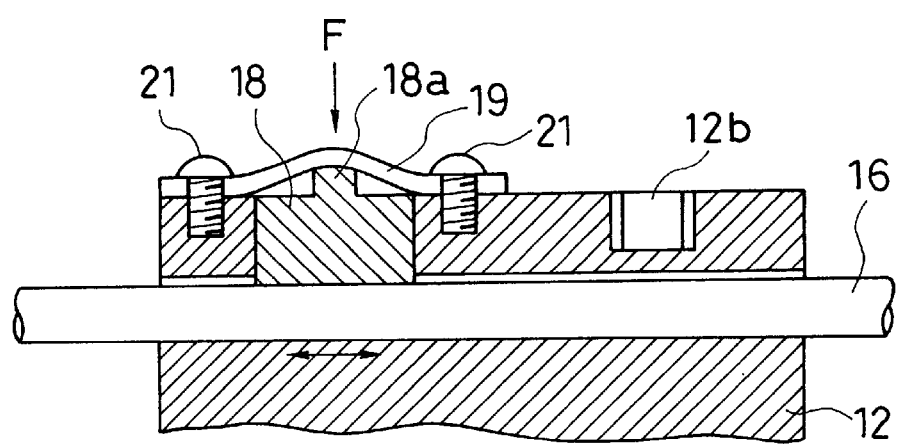
FIG. 3 is a sectional view showing a constitution of a frictionally coupled portion of the actuator shown by FIG. 1.

An explanation will be given of embodiments of the present invention as follows. An explanation will firstly be given of a first embodiment. FIG. 1 is a perspective view showing an actuator by disassembling it into constituent members, FIG. 2 is a perspective view showing a state of assembling the actuator and FIG. 3 is a sectional view showing a constitution of a portion in which a drive shaft, a slider block and a pad are frictionally coupled. An actuator 10 is constituted by a frame 11, support blocks 13, 13a and 14, a drive shaft 16, a piezoelectric element 15, a slider block 12 or the like. The drive shaft 16 is supported by the support block 13a and the support block 14 movably in the axial direction. One end of the piezoelectric element 15 is fixedly adhered to the support block 13 and other end thereof is fixedly connected to one end of the drive shaft 16. The drive shaft 16 is supported such that it can be displaced in the axial direction (arrow mark "a" direction and direction opposed thereto) when a displacement in the thickness direction of the piezoelectric element 15 is caused.

The drive shaft 16 penetrates the slider block 12 in the horizontal direction, an opening portion 12a is formed at an upper portion which the drive shaft 16 penetrates and an upper half of the drive shaft 16 is exposed. Further, a pad 18 which is brought into contact with the upper half of the drive shaft 16 is fittedly inserted into the opening portion 12a, a projection 18a is installed at the upper portion of the pad 18, the projection 18a of the pad 18 is pushed down by a leaf spring 19 and downward urging force F is exerted on the pad 18 such that it is brought into contact with the drive shaft 16. Further, numeral 21 designates a screw for fixing the leaf spring 19 to the slider block 12. The constitution of a portion in which the drive shaft 16, the slider block 12 and the pad 18 are brought into contact with each other is shown in reference to FIG. 3.

By the constitution, the drive shaft 16, the pad 18 and the slider block 12 are frictionally coupled by pertinent frictional coupling force. Adjustment of the urging force F determining the frictional coupling force can be controlled by a degree of fastening the screws 21.

Figure 4A:
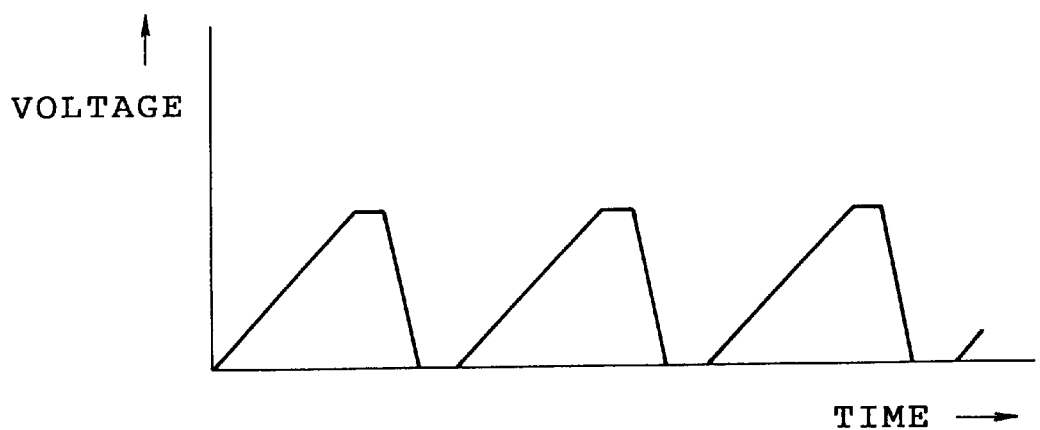
FIGS. 4(a) and 4(b) are diagrams for explaining waveforms of drive pulses.

Next, an explanation will be given of the operation. First, when a sawtooth wave drive pulse having a gradual rise portion and a steep fall portion as shown by FIG. 4(a) is applied on the piezoelectric element 15, at the gradual rise portion of the drive pulse, the piezoelectric element 15 is displaced to elongate gradually in the thickness direction and the drive shaft 16 coupled to the piezoelectric element 15 is also displaced gradually in the positive direction (arrow mark "a" direction). At this moment, the slider block 12 frictionally coupled to the drive shaft 16 is moved in the positive direction along with the drive shaft 16 by the frictional coupling force.

At the steep fall portion of the drive pulse, the piezoelectric element 15 is displaced to contract rapidly in the thickness direction and the drive shaft 16 coupled to the piezoelectric element 15 is also displaced rapidly in the negative direction (direction opposed to arrow mark "a"). At this moment, the slider block 12 frictionally coupled to the drive shaft 16 remains unmoved substantially at the position by overcoming the frictional coupling force by inertia force. By continuously applying the drive pulses to the piezoelectric element 15, reciprocating oscillation having different speeds is caused in the drive shaft 16 by which the slider block 12 frictionally coupled to the drive shaft 16 can be moved continuously in the positive direction.

Further, "substantially" mentioned here includes a case in which the slider block 12 follows the drive shaft 16 while causing a slip on a frictionally coupled face between the slider block 12 and the drive shaft 16 and the slider block 12 is moved in the arrow mark "a" direction as a whole by a difference in drive time periods in either of the positive direction and the direction opposed thereto.

Figure 4B:
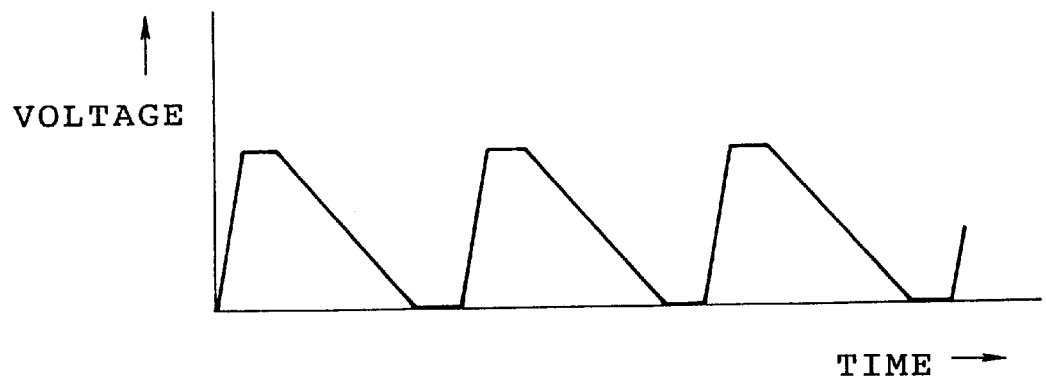

In moving the slider block 12 in a direction opposed to the previous direction (direction opposed to arrow mark "a"), the movement can be achieved by changing the waveform of the sawtooth wave drive pulse applied to the piezoelectric element 15 and applying a drive pulse comprising a steep rise portion and a gradual fall portion as shown by FIG. 4(b).

Next, an explanation will be given of a sealing treatment of the piezoelectric element 15 of the actuator 10, a portion where the piezoelectric element 15 is fixedly coupled to the support block 13 and a portion where the piezoelectric element 15 is fixedly coupled to the drive shaft 16.

Sealing the piezoelectric element, it is possible to seal the portion where the piezoelectric element is fixedly coupled to the support block and the portion where the piezoelectric element is fixedly coupled to the drive shaft respectively by separate sealing materials, but it is preferable to seal said coupled portion with the same sealing material for improving the operational or working efficiency. Hence, as shown by FIG. 5(a), the actuator 10 is dipped in a vessel V into which a solution of a sealing material P dissolved by a solvent is put by which the sealing material is adhered thereto and as shown by FIG. 5(b), all of a portion from the side of the support block 13 to the portion where the piezoelectric element 15 is fixedly coupled to the drive shaft 16, is dipped in the vessel by which the sealing material is adhered. Thereafter, the solvent is evaporated and as shown by FIG. 5(c), a seal film FM is formed at surroundings of the piezoelectric element 15, the portion where the piezoelectric element is fixedly coupled to the support block 13 and the portion where the piezoelectric element is fixedly coupled to the drive shaft 16.

In this way, the piezoelectric element 15 of the actuator 10, the portion where the piezoelectric element 15 is fixedly coupled to the support block 13 and the portion where the piezoelectric element 15 is fixedly coupled to the drive shaft 16 can be sealed. Further, the formed film maintains a sealing effect against temperature or humidity and the film is formed in a thickness by which the film is elastically deformed in moving the piezoelectric element or the drive shaft and the movement is not hampered.

Alternatively, it is possible to seal with seal film FM either one of the coupled portion of piezoelectric element 15 and support block 13 or the coupled portion of piezoelectric element 15 and drive shaft 16.

Figure 6:
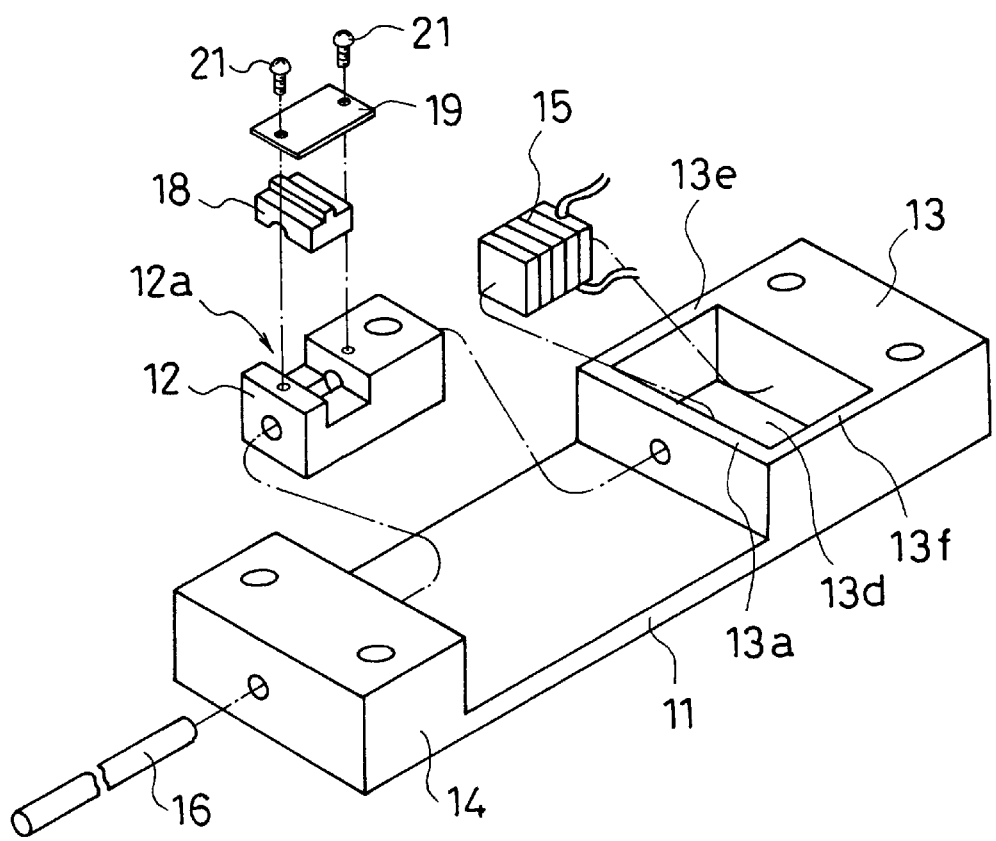
FIG. 6 is a perspective view showing an actuator according to a second embodiment of the present invention which is disassembled into the constituent members.

Next, an explanation will be given of a second embodiment of the present invention. FIG. 6 is a perspective view showing a second embodiment of an actuator in which the constitution of the actuator is slightly different from the constitution of the actuator shown by FIG. 1 and FIG. 2. That is, wall faces 13e and 13f are provided at open side face portions between the support blocks 13 and 13a of the actuator shown by FIG. 1 and FIG. 2 by which a box-like portion 13d is formed. The other constitution of the second embodiment, that one end of the piezoelectric element 15 is fixedly adhered to the support block 13 and the drive shaft 16 is fixedly adhered to another end of the piezoelectric element 15 and others remain unchanged from that in the actuator shown by FIG. 1 and FIG. 2. Further, the driving operation remains unchanged from that in the actuator shown by FIG. 1 and FIG. 2 and therefore, an explanation of the constitution or the driving operation will be omitted.

Figure 7:
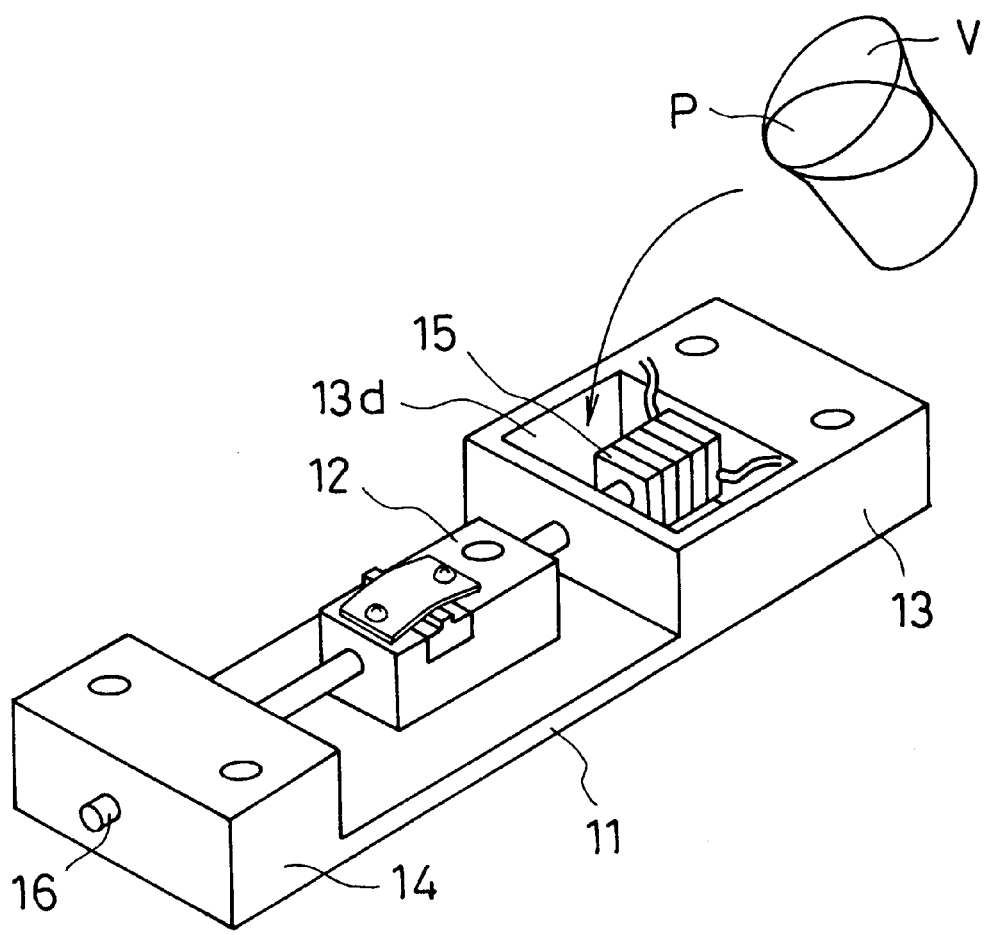
FIG. 7 is a view for explaining a sealing treatment of an actuator.

According to the constitution, in order to seal the piezoelectric element 15, the portion where the piezoelectric element 15 is fixedly coupled to the support block 13 and the portion where the piezoelectric element 15 is fixedly coupled to the drive shaft 16, as shown by FIG. 7, the solution of the sealing material P dissolved by a solvent is injected into the box-like portion 13d and thereafter, the sealing material P is dried by evaporating the solvent.

According to the constitution, the piezoelectric element, the portion where the piezoelectric element is fixedly coupled to the support block and the portion where the piezoelectric element is fixedly coupled to the drive shaft are solidified by the sealing material and accordingly, high sealing effect can be achieved. Further, as the sealing material P is a material which can be elastically deformed sufficiently to prevent the movement of the piezoelectric element or the drive shaft from being hampered.

A sealing material whose major component is silicone can be used and further, the sealing material whose major component is one kind or more of materials selected from the group consisting of isobutylene-isoprene rubber, fluorinated rubber, butadiene rubber, styrene-butadiene rubber, ethylene-propylene rubber, isoprene rubber and chloroprene rubber can be used.

Further, a sealing material whose major component is epoxy resin or elastomer (high molecular substance having rubber elasticity) can also be used.

Other than these, a fluororesin base material can also be used.

According to the fluororesin base material, a coating layer can thinly be formed compared with a sealing material of silicone base or epoxy base and effects little influence on the function of the electromechanical transducer that is sealed. Further, the material also has an advantage where the water repellency is excellent.

The following materials can be used as the fluororesin material:

1. polytetrafluoroethylene (PTFE)
2. ethylene tetrafluoride/propylene hexafluoride copolymer (FEP)
3. ethylene tetrafluoride/perfluoroalkoxyethylene copolymer (PFA)
4. trifluorinated ethylene chloride (CTFE)
5. ethylene tetrafluoride/ethylene copolymer (ETFE)
6. polyvinylidene fluoride (PVDF)
7. polyvinyl fluoride (PVF)

Further, the fluororesin base material is easy to handle since it is generally a liquid having low viscosity. Further, the material is cured by only leaving it at normal temperature without carrying out a special curing treatment (heat treatment) thereon as in an epoxy base material. Further, the material is cured in a short period of time compared with a silicone base material.

Figure 8:
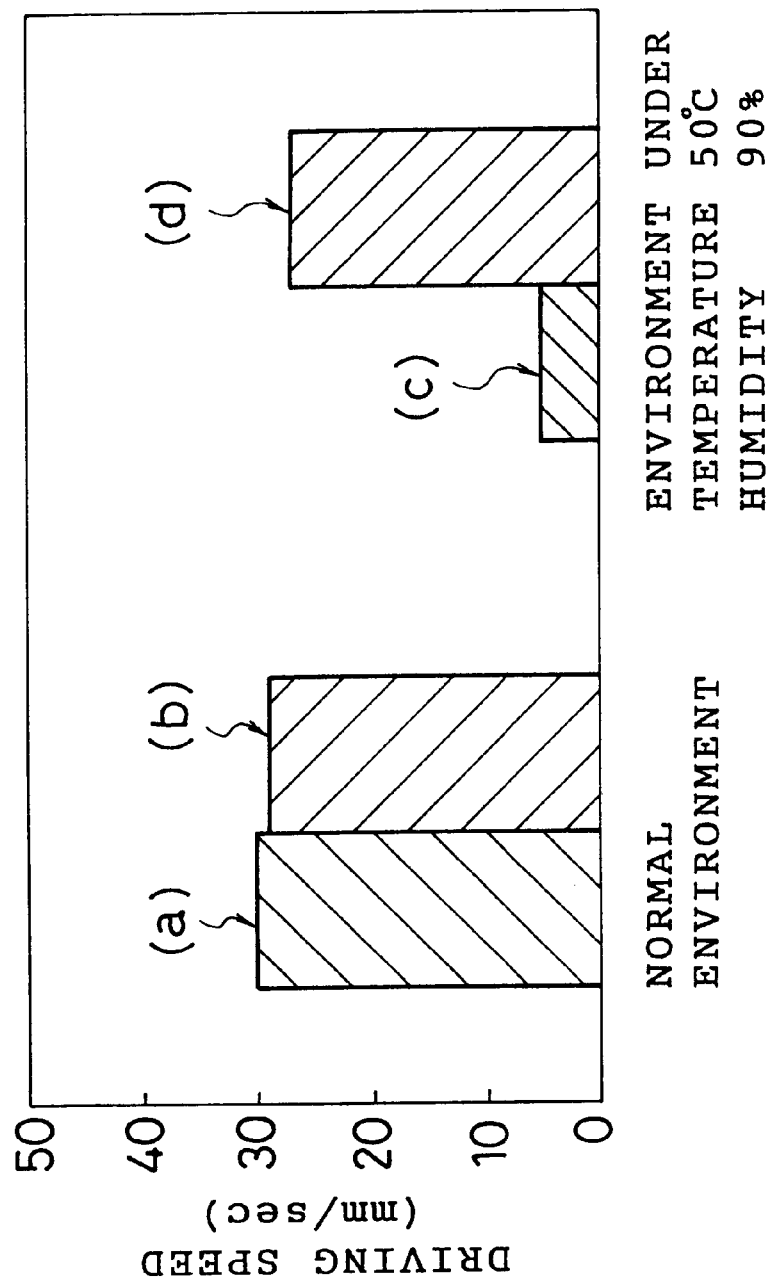
FIG. 8 is a diagram for explaining a comparison between drive speeds when the sealing treatment is carried out and when it is not carried out.

Next, a description will be given of an effect of subjecting the actuator to the sealing treatment. FIG. 8 shows a driving speed under a normal environment and a drive speed under an environment of 50° C. and the relative humidity of 90% in respect of an actuator which has been subjected to the sealing treatment and an actuator which has not been subjected to the sealing treatment.

As is apparent from FIG. 8, there is no significant difference between the driving speed (a) of the actuator which has not been subjected to the sealing treatment and the driving speed (b) of the actuator which has been subjected to the sealing treatment under the normal environment. However, under the environment of high temperature and high humidity, although the driving speed (c) of the actuator which has not been subjected to the sealing treatment is significantly decreased, the driving speed (d) of the actuator which has been subjected to the sealing treat is decreased by only little amount. The result shows that the sealing treatment is extremely effective in maintaining the function of the actuator.

Next, an explanation will be given of an X-axis movable stage to which the actuator explained above is applied as a third embodiment. The X-axis movable stage is used in a measuring device for measuring a sample mounted on a stage by finely moving it in X-axis direction and a measurement under the environment of high temperature and high humidity can be carried out by the X-axis movable stage using the actuator explained before.

Figure 9:
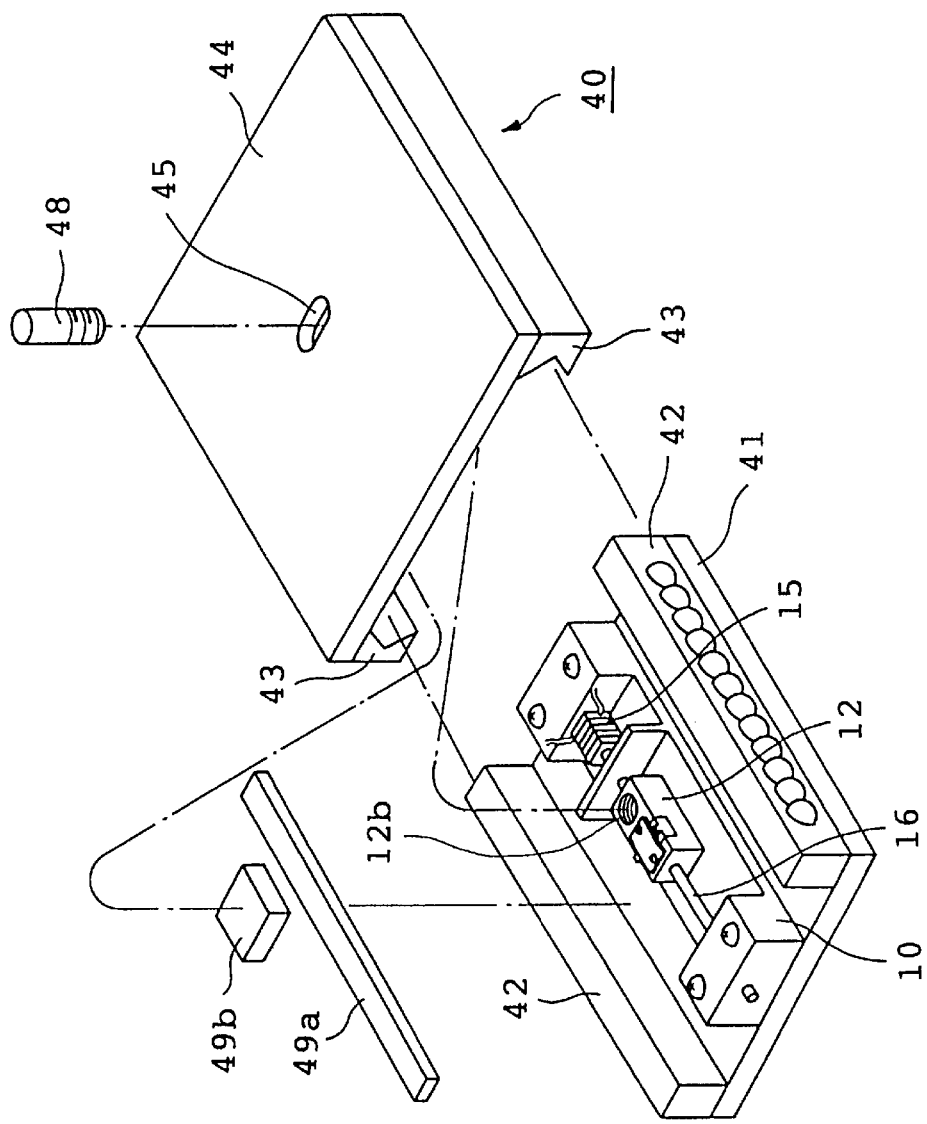
FIG. 9 is a view showing disassembled an X-axis movable stage having the actuator according to the first embodiment.

FIG. 9 is a perspective view illustrating disassembled X-axis movable stage 40 constituted by using the sealed actuator shown in FIG. 5(c). in FIG. 9, numeral 41 designates a base frame; 42 designates linear ball bearings provided at the side edge of the base frame 41; 44 designates a table for placing an object provided with a slide 43 to be engaged with the linear ball bearings at its lower surface. Moreover, on the base frame 41, the actuator 10 explained previously is stationarily fixed at the center thereof.

Two linear ball bearings 42 provided at the side edges of the base frame 41 are well known, arranged in parallel with each other and engaged with two slides 43 arranged in parallel at the side edge of the table 44 to movably support movable in parallel the table 44 with respect to the base frame 41.

The table 44 allows formation of the hole 45, at its center, to be engaged with the coupling pin 48 implanted on the hole 12b of the slider block 12 (see FIG. 1) of the actuator 10. The hole 45 is narrowly formed in the moving direction of the table 44, engaged with the coupling pin 48 without any looseness in the moving direction of the table 44, engaged loosely with the coupling pin 48 in the direction orthogonal to the moving direction in view of providing no interference on movement of the table even if there is a certain error in the operating direction of the actuator 10 and in the moving direction of the table 44 supported by the liner ball bearings 42.

In order to detect the position of the table 44, the movable stage 40 is also provided with a position detector (MR sensor) consisting of the magnetization rod 49a magnetized as N and S poles in the predetermined interval and magneto-resistance 49b.

As has been explained, the actuator using the electromechanical transducer of the present invention is featured in that the electromechanical transducer, a portion where the electromechanical transducer is fixedly bonded to a fixing member and a portion where the electromechanical transducer is fixedly coupled to a driving member are sealed by a sealing material and accordingly, even in the case where it is used in an environment of high temperature and/or high humidity, or in the case where it is left in the environment of high temperature and/or high humidity, a possibility of causing inconveniences where electrodes of the electromechanical transducer are shortcircuitted, the portion where the electromechanical transducer is fixedly adhered to the fixing member, the portion where the electromechanical transducer is fixedly coupled to the driving member or the like is peeled off, the function is deteriorated, the apparatus cannot be driven and so on, can be eliminated and stable driving function can be maintained even under a severe environment of high temperature and/or high humidity or the like.

Further, according to an apparatus such as the Xaxis movable stage to which the above-described actuator is applied, the actuator that is a driving device thereof achieves stable driving function even under the severe environment of high temperature and/or high humidity or the like and accordingly, an apparatus suitable for an inspection device or a measuring device which carries out inspection or measurement of a sample under such a severe environment can be provided. This application is based on patent application No. 9-181879 filed in Japan, the contents of which are hereby incorporated by reference.

As many apparently different embodiments of this invention may be made without departing from the spirit and scope thereof, it is to be understood that the invention is not limited to the specific embodiments thereof except as defined in the appended claims.

What is claimed is:

1. An actuator using an electromechanical transducer comprising:
   an electromechanical transducer having a first end and a second end;
   a fixing member fixedly coupled to said first end of the electromechanical transducer for fixing the electromechanical transducer;
   a driving member fixedly coupled to said second end of the electromechanical transducer for being displaced along with the electromechanical transducer;
   a driven member frictionally coupled to the driving member such that the driven member is displaced along the driving member when the electromechanical transducer is active; and
   a sealing structure sealing at least one of a portion where the electromechanical transducer is fixedly coupled to the fixing member and a portion where the electromechanical transducer is fixedly coupled to the driving member, wherein the sealing structure comprises a sealing material.

2. An actuator using an electromechanical transducer according to claim 1,
   wherein a major component of the sealing material is silicone.

3. An actuator using an electromechanical transducer according to claim 1,
   wherein a major component of the sealing material is one kind or more of materials selected from the group consisiting of isobutylene-isoprene rubber, fluorinated rubber, butadiene rubber, styrene-butadiene rubber, ethylene-propylene rubber, isoprene rubber and chloroprene rubber.

4. An actuator using an electromechanical transducer according to claim 1,
   wherein a major component of the sealing material is epoxy resin.

5. An actuator using an electromechanical transducer according to claim 1, wherein a major component of the sealing material is elastomer.

6. An actuator using an electromechanical transducer according to claim 1,
   wherein a major component of the sealing material is fluororesin.

7. An actuator using an electromechanical transducer according to claim 1, wherein the sealing structure seals the electromechanical transducer, the portion where the electromechanical transducer is fixedly coupled to the fixing member, and the portion where the electromechanical transducer is fixedly coupled to the driving member.

8. An actuator using an electromechanical transducer according to claim 1,
   wherein the sealing material is continuous between said first end of said electromechanical transducer where the electromechanical transducer is fixedly coupled to the fixing member and said second end of said electromechanical transducer where the electromechanical transducer is fixedly coupled to the driving member, said sealing material elastically deforming as said electromechanical transducer and said driving member are displaced.

9. An actuator using an electromechanical transducer according to claim 1, wherein said fixing member includes a frame having a first support block and a second support block, said electromechanical transducer being fixedly coupled to said first support block, said driving member passing through said second support block, the sealing material encasing the electromechanical transducer between said first and second support blocks.

10. An actuator using an electromechanical transducer according to claim 1,
    wherein the fixing member includes first and second support blocks and first and second wall faces to define a cavity, said electromechanical transducer being in said cavity, said sealing material filling at least a portion of said cavity and encapsulating said electromechanical transducer.

11. An actuator using an electromechanical transducer according to claim 1, further comprising:
    a base frame;
    at least one linear ball bearing mounted on said base frame; and
    a table engaging said linear ball bearing for movement relative to the base frame along a predetermined direction, said table having a hole formed therethrough,
    said driven member further comprising a coupling mechanism for at least partially engaging said hole in said table.

12. An actuator using an electromechanical transducer according to claim 13, wherein said hole is elongated in a direction orthogonal to the predetermined direction of movement.

13. An apparatus having an actuator using an electromechanical transducer as a drive source, said apparatus comprising:
    an electromechanical transducer having a first end and a second end;
    a fixing member fixedly coupled to said first end of the electromechanical transducer for fixing the electromechanical transducer;
    a driving member fixedly coupled to said second end of the electromechanical transducer for displacement along with the electromechanical transducer;
    a driven member frictionally coupled to the driving member such that the driven member is displaced along the driving member when the electromechanical transducer is active;
    a sealing structure sealing at least one of a portion where the electromechanical transducer is fixedly coupled to the fixing member and a portion where the electromechanical transducer is fixedly coupled to the driving member by a sealing material; and
    a movable element in said apparatus coupled to the driven member.

14. An apparatus having an actuator using an electromechanical transducer as a drive source according to claim 8,
    wherein the sealing structure seals the electromechanical transducer, the portion where the electromechanical transducer is fixedly coupled to the fixing member, and the portion where the electromechanical transducer is fixedly coupled to the driving member.

15. An apparatus having an actuator using an electromechanical transducer as a drive source according to claim 8, wherein the sealing material is continuous between said first end of said electromechanical transducer where the electromechanical transducer is fixedly coupled to the fixing member and said second end of said electromechanical transducer where the electromechanical transducer is fixedly coupled to the driving member, said sealing material elastically deforming to accommodate displacement of said electromechanical transducer and said driving member.

16. An apparatus having an actuator using an electromechanical transducer as a drive soure according to claim 8, wherein said fixing member includes a frame having a first support block and a second support block, said electromechanical transducer fixedly coupled to said first support block, said driving member passing through said second support block, the sealing material encasing the electromechanical transducer between said first and second support blocks.

17. An apparatus having an actuator using an electromechanical transducer as a drive source according to claim 8, wherein the fixing member includes first and second support blocks and first and second wall faces to define a cavity, said electromechanical transducer being in said cavity, said sealing material filling at least a portion of said cavity and encapsulating said electromechanical transducer.

18. An apparatus having an actuator using an electromechanical transducer as a drive source according to claim 8, further comprising:

a base frame;

at least one linear ball bearing mounted on said base frame;

said movable element engaging said linear ball bearing for movement relative to the base frame along a predetermined direction, said moveable element having a hole formed therethrough, said driven member further comprising a coupling mechanism for at least partially engaging said hole in said movable element.

19. An apparatus having an actuator using an electromechanical transducer as a drive source according to claim 18, wherein said hole is elongated in a direction orthogonal to the predetermined direction of movement.

* * * * *

UNITED STATES PATENT AND TRADEMARK OFFICE
CERTIFICATE OF CORRECTION

PATENT NO.   : 6,211,602 B1
DATED         : April 3, 2001
INVENTOR(S)  : Ryuichi Yoshida et al.

It is certified that error appears in the above-identified patent and that said Letters Patent is hereby corrected as shown below:

Column 8, claim 12,
Line 31, delete "claim 13,", and insert -- claim 11, --.

Column 8, claim 14,
Line 59, delete "claim 8,", and insert -- claim 13, --.

Column 8, claim 15,
Line 66, delete "claim 8,", and insert -- claim 13, --.

Column 9, claim 16,
Line 10, delete "claim 8,", and insert -- claim 13, --.

Column 9, claim 17,
Line 20, delete "claim 8,", and insert -- claim 13, --.

Column 10, claim 18,
Line 4, delete "claim 8,", and insert -- claim 13, --.

Signed and Sealed this

Twentieth Day of November, 2001

Attest:

Nicholas P. Godici

Attesting Officer

NICHOLAS P. GODICI
*Acting Director of the United States Patent and Trademark Office*